(12) United States Patent
Yang

(10) Patent No.: US 8,890,694 B2
(45) Date of Patent: Nov. 18, 2014

(54) ANTI-THEFT HANG TAG

(71) Applicant: Xiao Hui Yang, Saratoga, CA (US)

(72) Inventor: Xiao Hui Yang, Saratoga, CA (US)

(73) Assignee: W G Security Products, Campbell, CA (US)

( * ) Notice: Subject to any disclaimer, the term of this patent is extended or adjusted under 35 U.S.C. 154(b) by 56 days.

(21) Appl. No.: 13/719,496

(22) Filed: Dec. 19, 2012

(65) Prior Publication Data

US 2014/0071643 A1    Mar. 13, 2014

Related U.S. Application Data

(63) Continuation-in-part of application No. 13/614,208, filed on Sep. 13, 2012, now Pat. No. 8,421,633.

(51) Int. Cl.
*G08B 13/24* (2006.01)
*H05K 5/02* (2006.01)
*G08B 13/14* (2006.01)

(52) U.S. Cl.
CPC .......... *H05K 5/0208* (2013.01); *G08B 13/2434* (2013.01); *G08B 13/2448* (2013.01); *G08B 13/1463* (2013.01)
USPC ..................... 340/572.8; 340/568.1; 340/10.1

(58) Field of Classification Search
USPC ............. 340/572.8, 572.1–572.7, 527.9, 541, 340/551, 568.1, 555–556, 552, 10.1, 10.5
See application file for complete search history.

(56) References Cited

U.S. PATENT DOCUMENTS

| | | | |
|---|---|---|---|
| 931,685 A | 8/1909 | Crim | |
| 1,347,467 A | 7/1920 | Scott | |
| 3,966,033 A | 6/1976 | Doo | |
| 3,995,900 A | 12/1976 | Humble et al. | |
| 4,398,404 A | 8/1983 | Wake | |
| 4,574,600 A | 3/1986 | Moffett | |
| 5,917,412 A * | 6/1999 | Martin | 340/572.3 |
| 6,018,968 A | 2/2000 | Sides | |
| 6,057,762 A | 5/2000 | Dusza | |
| 6,374,647 B1 | 4/2002 | Holmgren | |
| 6,845,640 B2 * | 1/2005 | Loeff et al. | 70/63 |
| D523,729 S | 6/2006 | Gorst | |
| 7,068,172 B2 * | 6/2006 | Yang et al. | 340/572.3 |
| 7,134,302 B2 | 11/2006 | Gorst | |
| 7,190,272 B2 | 3/2007 | Yang et al. | |
| 7,249,401 B2 * | 7/2007 | Copen et al. | 24/704.1 |
| 7,266,979 B2 * | 9/2007 | Belden, Jr. | 70/57.1 |
| 7,400,254 B2 | 7/2008 | Yang et al. | |
| 7,412,857 B2 | 8/2008 | Kolton et al. | |

(Continued)

*Primary Examiner* — Daniel Previl
(74) *Attorney, Agent, or Firm* — Waters Law Group, PLLC; Robert R. Waters; Brian W. Foxwoth

(57) ABSTRACT

An anti-theft device comprised of a housing hingably connected to a cover. The housing and cover can move from an open position to a closed position to clasp and secure an article to be monitored. The housing and cover have latch components. When the housing and cover are rotated to a closed position in relation to one another, a latch component on the cover interconnects with a latch component of the housing to hold the housing and cover in a closed position. The latch components may be releasably lockable and may be released by application of a magnet to a blocking component in the housing which has a magnetically-attractable element associated with it, combined with manual manipulation of a latch switch to disengage the latching components of the housing and cover. The anti-theft device carries at least a passive electronic article surveillance element. More advanced electronic article surveillance elements may also be carried in the housing.

12 Claims, 10 Drawing Sheets

(56) References Cited

U.S. PATENT DOCUMENTS

| | | | |
|---|---|---|---|
| 2006/0070410 A1* | 4/2006 | Fuss et al. | 70/57.1 |
| 2010/0214102 A1 | 8/2010 | Yang | |
| 2011/0068906 A1 | 3/2011 | Shafer et al. | |
| 2011/0121973 A1 | 5/2011 | Yang | |
| 2012/0001756 A1 | 1/2012 | Mercier et al. | |
| 2012/0025980 A1 | 2/2012 | Derks et al. | |

* cited by examiner

ANTI-THEFT HANG TAG

CROSS REFERENCE TO RELATED APPLICATIONS

This application is a continuation-in-part application based on U.S. patent application Ser. No. 13/614,208, filed Sep. 13, 2012. U.S. patent application Ser. No. 13/614,208 is a continuation of U.S. patent application Ser. No. 12/754,031, filed Apr. 5, 2010 and issued as U.S. Pat. No. 8,269,631 on Sep. 18, 2012. U.S. patent application Ser. No. 12/754,031 is a continuation-in-part application based on U.S. patent application Ser. No. 12/726,879 filed on Mar. 18, 2010, and issued as U.S. Pat. No. 8,305,219 on Nov. 6, 2012. U.S. patent application Ser. No. 12/726,879 is a continuation-in-part of U.S. patent application Ser. No. 12/498,367, filed Jul. 7, 2009, and issued as U.S. Pat. No. 8,274,391 on Sep. 25, 2012. U.S. patent application Ser. No. 12/498,367 is a continuation-in-part application based on U.S. patent application Ser. No. 12/391,222 filed on Feb. 23, 2009, and issued as U.S. Pat. No. 8,144,014 on Mar. 27, 2012. U.S. patent application Ser. No. 12/391,222 in turn claims priority to U.S. Provisional Application 61/030,932, filed on Feb. 22, 2008, and U.S. Provisional Application 61/030,929 filed on Feb. 22, 2008. The entire disclosures contained in U.S. patent application Ser. No. 13/614,208, U.S. patent application Ser. No. 12/754,031, U.S. Pat. No. 8,269,631, U.S. patent application Ser. No. 12/726,879, U.S. Pat. No. 8,305,219, U.S. patent application Ser. No. 12/498,367, U.S. Pat. No. 8,274,391, U.S. patent application Ser. No. 12/391,222, U.S. Pat. No. 8,144,014, U.S. Provisional Application 61/030,932, and U.S. Provisional Application 61/030,929, including the attachments thereto, are incorporated herein by reference.

FIELD OF INVENTION

The present application is generally related to an anti-theft device, and more specifically, an anti-theft device that can be secured to objects to be monitored by encircling that object or an element of that object. Also, the device of the present application may have an appendage which can be engaged to a hook or other article from which the anti-theft device can be suspended. The device of the present application may be used with various electronic article surveillance (EAS) systems, including for example, an EAS system utilizing devices and deactivators featuring infrared or other wireless communication for deactivation and alarming and featuring dynamic time based pass code modification and other tamper resistant features, and/or an EAS system using passive element technology. In certain applications, the mere presence of the device may be deemed to be sufficient deterrence from theft and in those applications the anti-theft device may actually not have any EAS electronics.

BACKGROUND OF THE INVENTION

EAS systems have been in use for many years as a means of aiding the deterrence of theft in various types of retail establishments. One common type of EAS device involves the use of a small sensor tag comprised of durable material. The tag is affixed to the object to be monitored in such a way as to prevent easy, unauthorized removal of the tag. The EAS device is usually constructed and attached in such a way that it can only be removed from the object being monitored by specialized tools in the possession of authorized store personnel. In the event that an EAS monitoring device is not deactivated, or if it is removed from the retail establishment by unauthorized personnel, an alarm or other signal is activated. An alarm or other signal is likewise activated upon the unauthorized removal of the EAS device from the object being monitored, while the object being monitored is still within the retail establishment.

In many commercially available EAS systems, one or more antennas are placed at or near exits and entrances to the retail establishment. These antennas set up what are sometimes called interrogation zones, in which an EAS device may be sensed. At least one antenna serves the function of sending out what is called an interrogation signal. The EAS device, to which the object being monitored is attached, is affected by this signal and may respond with a signal of its own. Either the same antenna that sends out the interrogation signal or other additional antennas can sense the signals from the EAS device. The most effective way to do this is by stopping the broadcast of the interrogation signal to listen for the signals emanating from the EAS device. If an EAS device is sensed within the interrogation zone created by the antennas, it is presumed that a monitored object is being removed from the retail establishment without proper authorization, and alarms are set off. These alarms may be audible for general broadcast, or the alarms may be silent alarms in the form of a light at a security station, etc. Additionally, some EAS devices have onboard audible alarm generators and can generate audible alarms by themselves. These EAS devices may produce this audible alarm when onboard logic elements determine that the EAS device is being removed from the retail establishment, or when the larger EAS system communicates to the EAS device to alarm. The onboard logic elements and the larger EAS system may also cause the EAS device to cease to alarm under certain situations.

A common manner of attempting to defeat an EAS device is to forcibly disengage it from the object to be monitored. A counter-measure which may be employed by an EAS device is the introduction of a switch which has its state changed and arms, or pre-arms, the EAS device when it is releasably attached to, or joined with, an object to be protected. For example, a switch can be positioned on the EAS device in such a manner that the object bears upon the switch and changes the switch's state when the EAS device and the object are joined together. Alternatively, for EAS devices comprised of multiple pieces, the switch may be located on one piece of the EAS device, and another piece of the EAS device may change the state of the switch when the EAS device is joined with the object to be monitored.

Associated devices may communicate with electronics within the EAS device to add an additional step to the device's arming process. When the EAS device is attached to the object to be monitored and the state of the switch is changed, this change of state functions to confirm that the EAS device is installed/attached, and authorized persons can use an associated device to wirelessly communicate with the EAS device to complete the process of arming the EAS device. Once armed, if the EAS device is forcibly disengaged from the object to be monitored, or if the EAS device is removed from the object to be monitored by an unauthorized person, the switch's state changes again, and the electronics of the EAS device determine that an alarm condition exists. The EAS device can sound an audible alarm with an onboard audible alarm generator, or wirelessly communicate an alarm to other elements of the EAS system.

SUMMARY OF EMBODIMENTS OF THE INVENTION

One embodiment of the present invention is for an anti-theft electronic article surveillance device comprised of two components hingably attached to each other. The two components can move from the many open positions of an open state to the closed position of a closed state. When in the closed position, the two components of the anti-theft device can combine to form a passageway which can receive an element of an object to be monitored. Embodiments of the anti-theft device may include an appendage which can be used to hang the anti-theft device and the object to be monitored from a hook or other article.

A housing is attached to one component of the anti-theft device, while a cover is attached to the other component. When the two components are in the closed position, the cover covers the top of the housing. Latching components on the housing and cover interact to keep the housing and cover engaged and in the closed position. These latching components are releasable so that the anti-theft device may be non-forcibly removed from an object by an authorized person. The housing may also contain a blocking component to block the latching components into a position which deters these components from being disengaged without authorization.

The housing contains an internal compartment which holds several mechanical and electronic components. Among the electronic components is a cover switch. The housing has an aperture through which the cover switch protrudes, extending out from the top of the housing. When the two components are in the closed position, and the cover covers the top of the housing, the cover bears upon the cover switch and changes the status of the cover switch. This change in status of the cover switch is recognizable and usable by the other electronic components.

In some embodiments, the internal compartment of the housing also holds a blocking component which prevents the unauthorized unlatching of the cover from the housing. When the two components are closed and the latch engaged, the blocking component moves into place to block the unauthorized unlatching of the cover from the housing. The blocking component can be manipulated, with the application of a magnet, to allow the unlatching of the cover from the housing so that the two components can be moved from the closed position to one of many open positions of an open state. Once the latching components of the housing and cover are disengaged from one another, the moving of the housing and cover components from a closed position to one of many open positions is assisted by pressure exerted from a cantilever spring located on the cover component or on the housing component.

Among the electronics which may be contained in the internal compartment of the housing of the anti-theft device are: a microprocessor, a circuit board, a battery, a passive EAS element, a cover switch, an audible alarm producing device, an infrared communication port or other communication elements, and a light emitting diode. The microprocessor or circuit board can detect when the cover switch undergoes a change in state. If the electronics also comprise a latch switch associated with the latching elements, the electronics monitor the switch for the latched or unlatched status of the device. If the change in state of the cover switch indicates that the cover is over the top of the housing, the device may be armed. Similarly, a change in state of the latch switch could be a step in arming/alarming.

In some embodiments, the EAS device may be armed with an external EAS device that communicates with the EAS device via the infrared communication port, radio frequency communications, or other communication elements. In some embodiments, a latch switch detects when the latch has been engaged and the combination of the cover switch and the latch switch arms the electronics. In some embodiments, the electronics may arm based on the state of the latch switch itself. The external device can be a hand held remote communication device or a device associated with a base station.

Once armed, if the electronics detect an unauthorized change in status, the electronics can determine an alarm condition and issue an alarm. For example, if a device is removed from a monitored object and the cover is removed from the top of the housing, the status of the cover switch will change. If an authorization signal is not previously received by the device, the electronics will determine an alarm condition and issue an alarm. This alarm may be an audible alarm or an alarm broadcast to a respective receiver in an electronic article surveillance anti-theft system. The broadcast may be by infrared communications, radio frequency communications, or other broadcast type communications.

Disarming of the EAS device may be accomplished by authorized personnel. An authorized person having access to other elements of the EAS system such as a hand held communication device or a base station having communication capabilities may disarm the device. Some embodiments will add another element of security with pass code capabilities in the respective electronics. The EAS device electronics of these embodiments are capable of storing a pass code which is known to the communication elements of the EAS system and which can be used to confirm to the EAS device that the disarming signal is authorized. A further element of security can be added by using clock based algorithms to change the pass code synchronously. In those embodiments, the EAS system and the EAS device both have clock generators and are programmed with the same algorithm and both are programmed with the same initial pass code. As time passes, the algorithm alters the pass code at preset intervals as regulated by the clock generators. This changing pass code further complicates unauthorized attempts to disarm the EAS device. If an EAS device is detached without being disarmed with the appropriate pass code, the EAS device will detect an alarm condition and generate an alarm.

To physically prevent the release of the latch, and the disengagement of the housing portion and the cover portion of the EAS device from a closed state to one of many open states, a blocking component or mechanism, as discussed above, may be employed. In one embodiment, a biased blocking component moves into a blocking position when the latch engages between the housing and the cover. The biased blocking component has a magnetically attractable element associated with it, and when a magnet is applied to the EAS device, the biased blocking component can be moved to a position where it no longer blocks the release of the latch. In some embodiments, if a magnet is used to detach an EAS device without authorization and the EAS device is still armed, the electronics detect an alarm condition and generate an alarm. In some embodiments a magnet may be built into a communication device so that the EAS device may be disarmed and its latch released for detachment using the same device.

BRIEF DESCRIPTION OF DRAWINGS

Additional utility and features of the invention will become more fully apparent to those skilled in the art by reference to the following drawings, which illustrate some of the primary features of preferred embodiments.

1, in one of its many open positions, and with a hanging appendage detached from the device.

Figure 3:
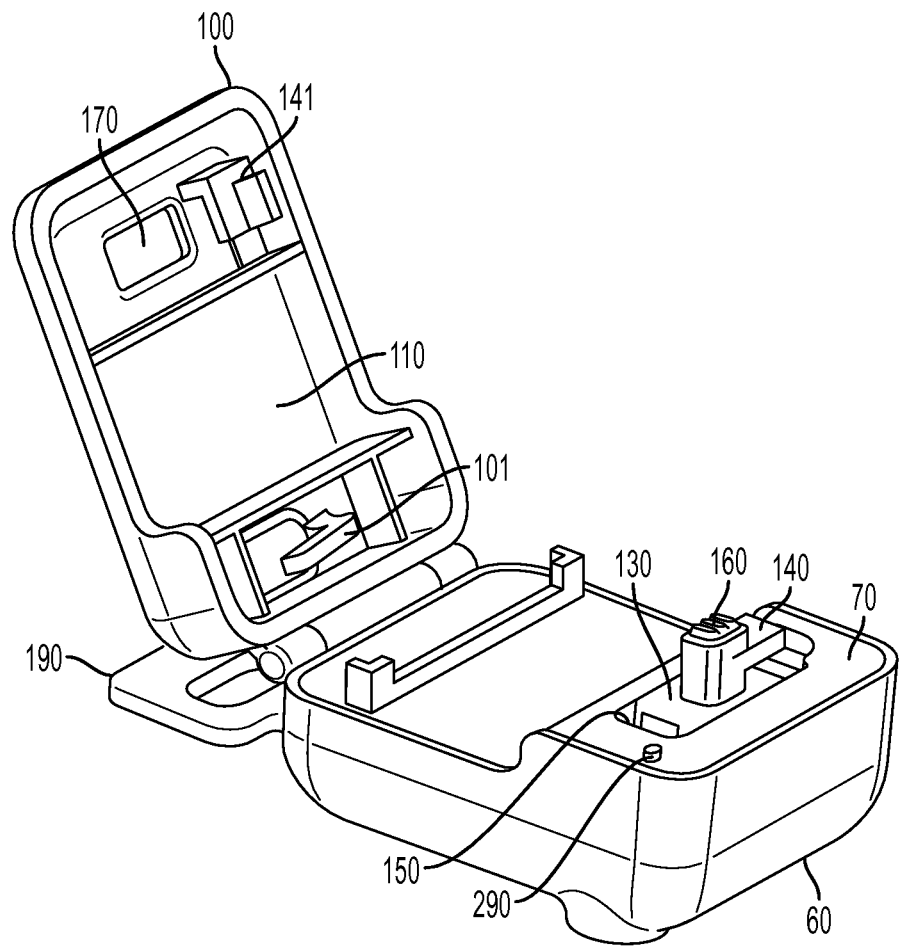

FIG. 3 is a perspective view of an embodiment of an anti-theft device, in one of its many open positions, and with a hanging appendage attached to the device.

Figure 4:
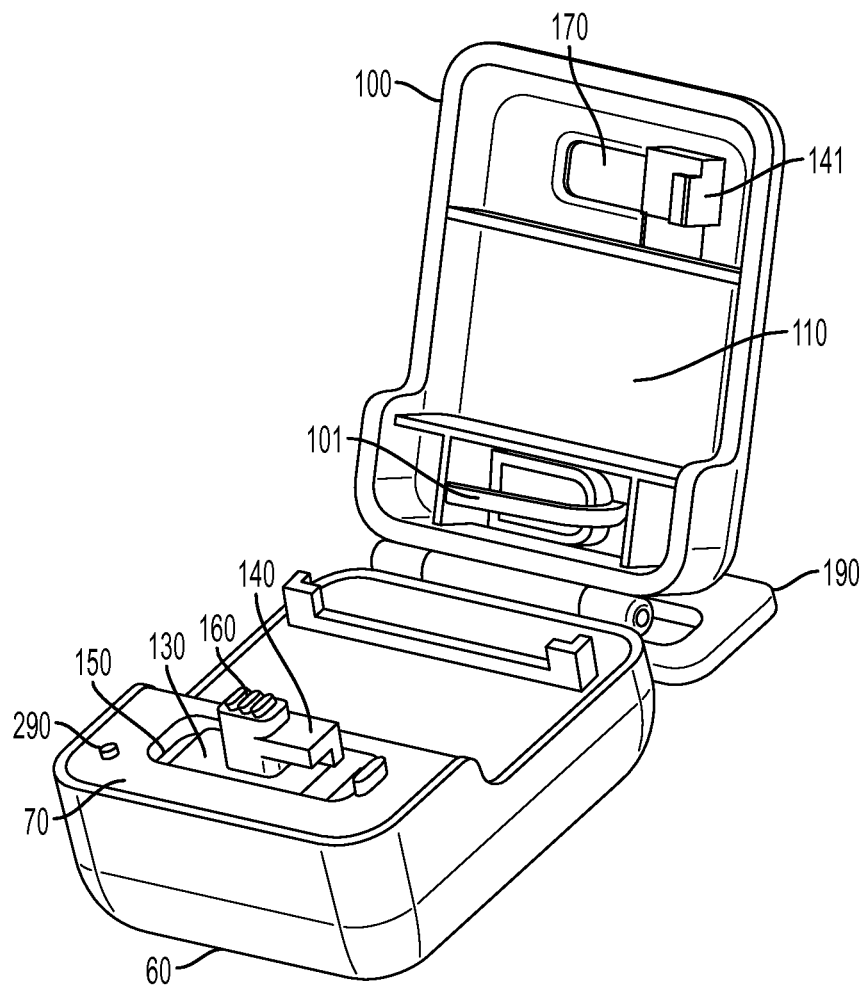

FIG. 4 is a perspective view of an embodiment of an anti-theft device, from a different perspective than shown in FIG. 3, in one of its many open positions, and with a hanging appendage attached to the device.

Figure 5:
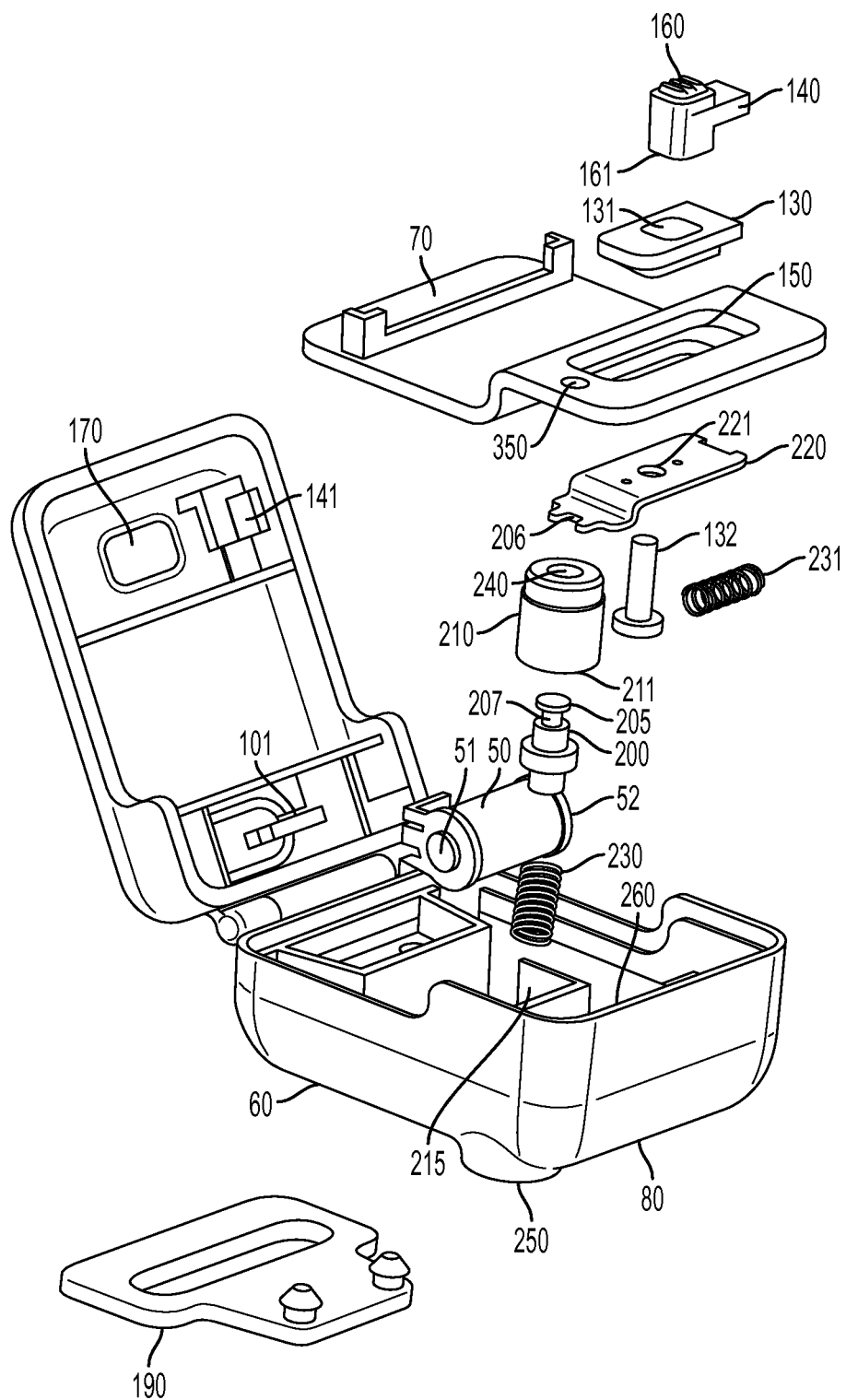

FIG. 5 is an exploded view of an embodiment of an anti-theft device in one of its many open positions.

Figure 6:
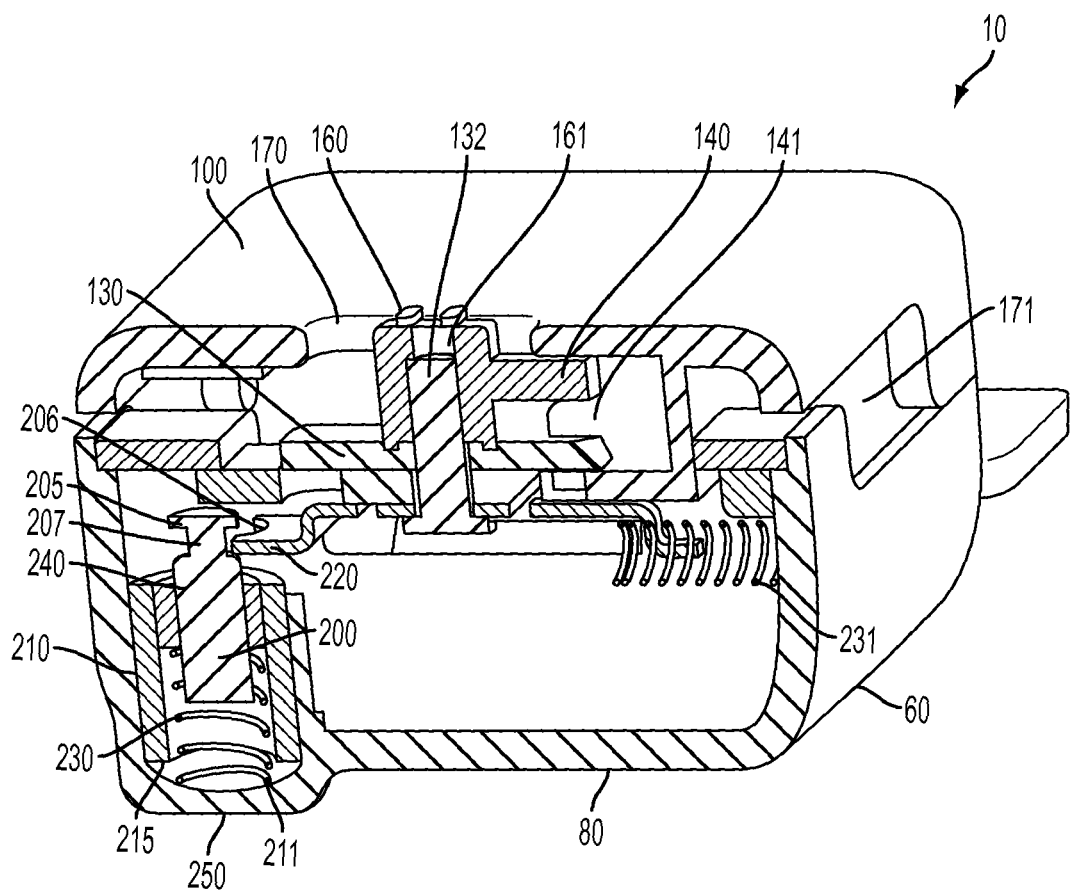

FIG. 6 is a cut-away perspective view of an embodiment of an anti-theft device in a closed position.

Figure 7:
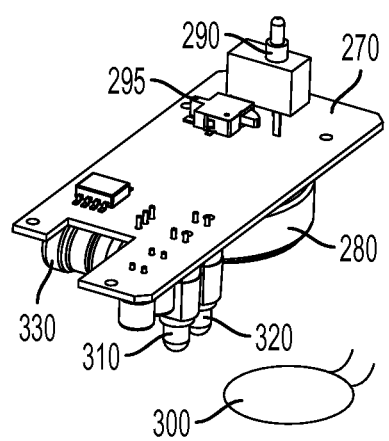

FIG. 7 is an exploded view of some of the active EAS elements of an embodiment of an anti-theft device.

Figure 8:
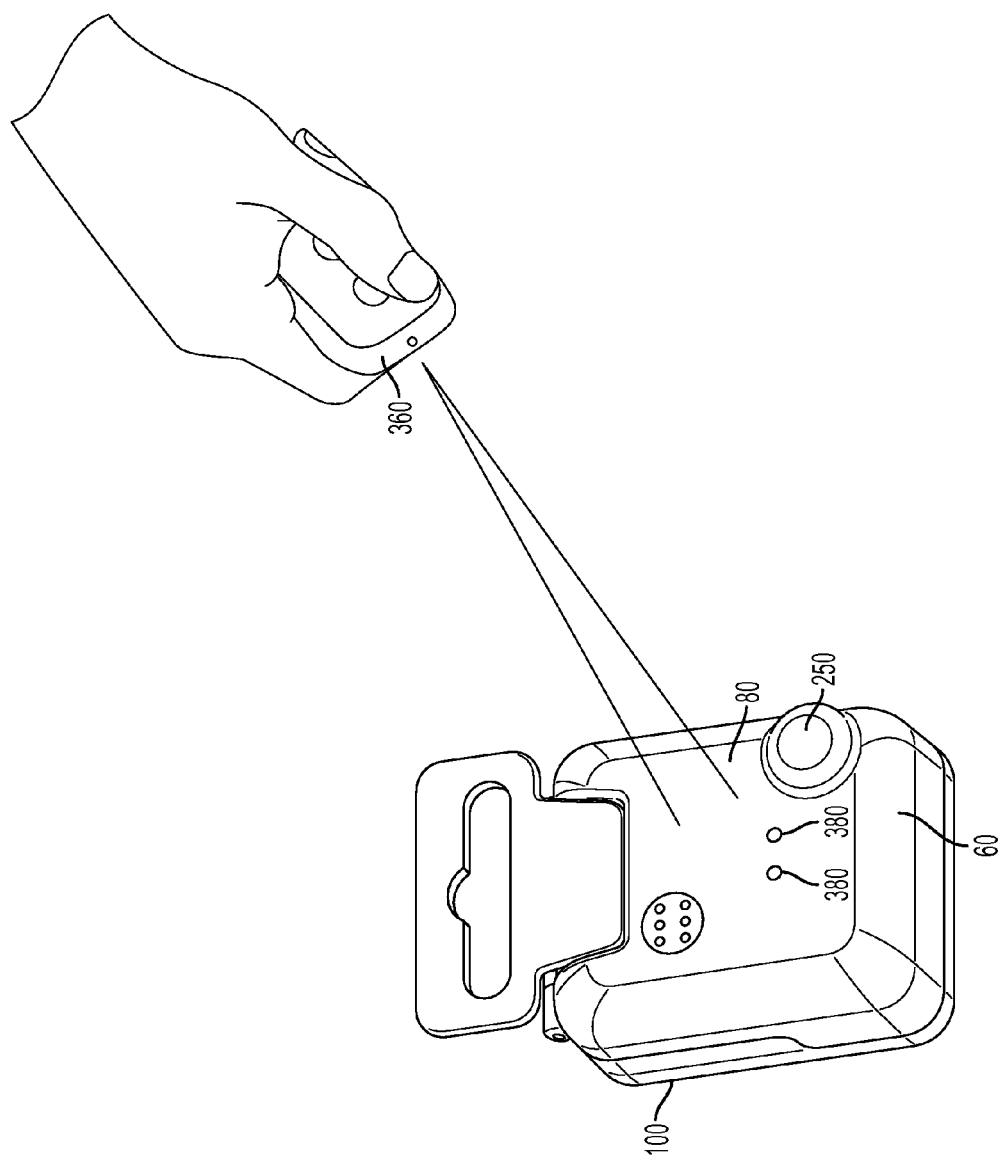

FIG. 8 is an embodiment of the present anti-theft device being communicated with, via a hand held remote.

Figure 9:
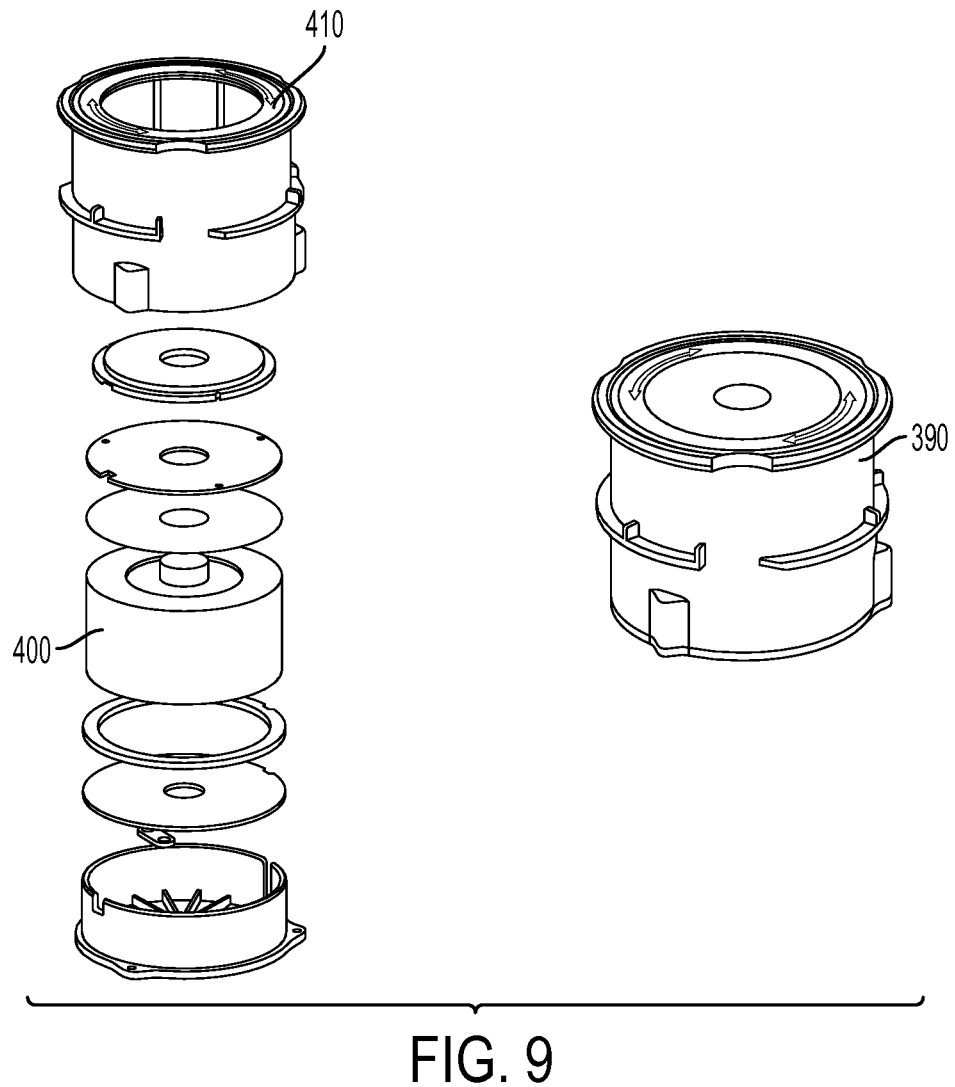

FIG. 9 is a hand held detacher that may be used with the embodiment of the present anti-theft device to activate, deactivate, and detach the various embodiments.

Figure 10:
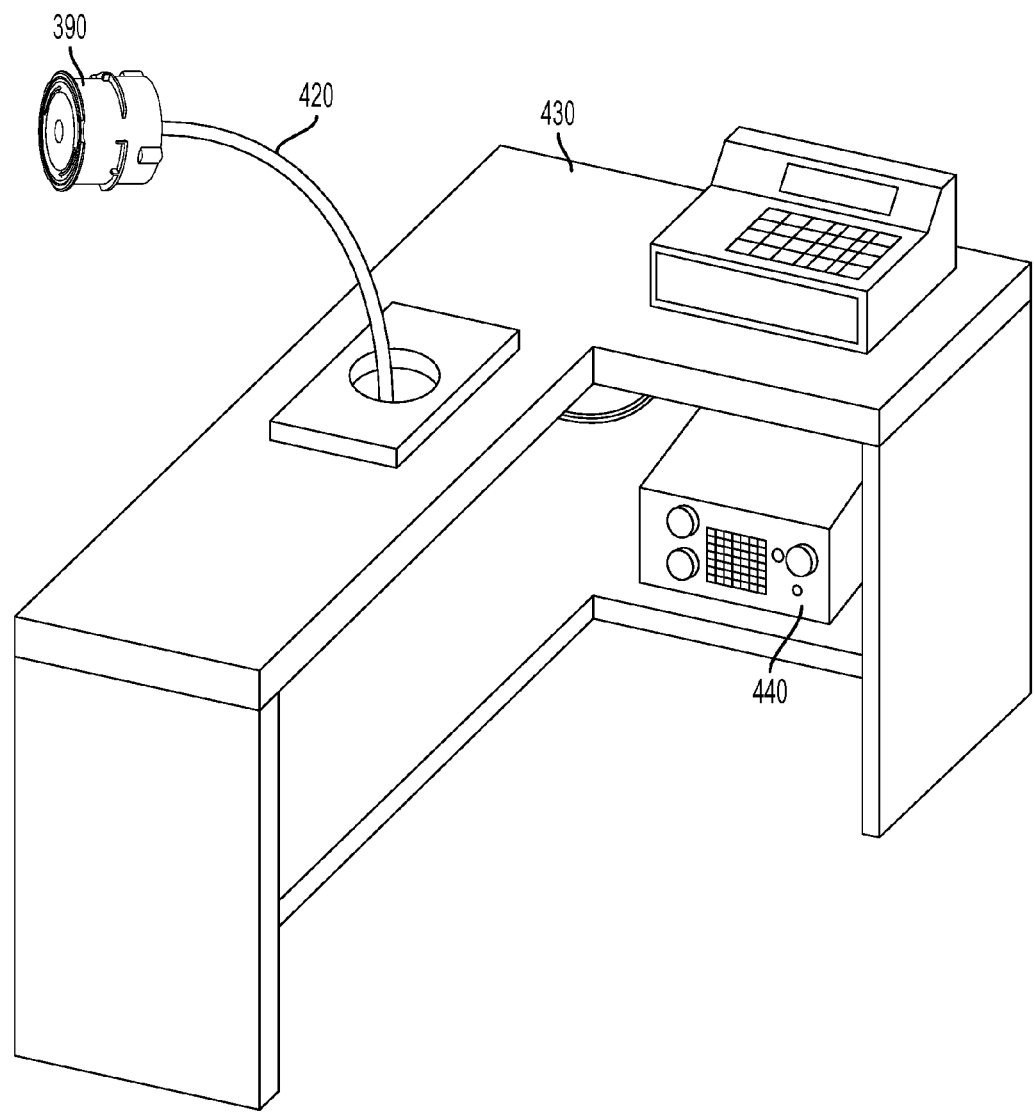

FIG. 10 is the hand held detacher of FIG. 9 as it might appear in a retail location, along with a base station.

DETAILED DESCRIPTION OF EMBODIMENTS OF THE INVENTION

Figure 1:
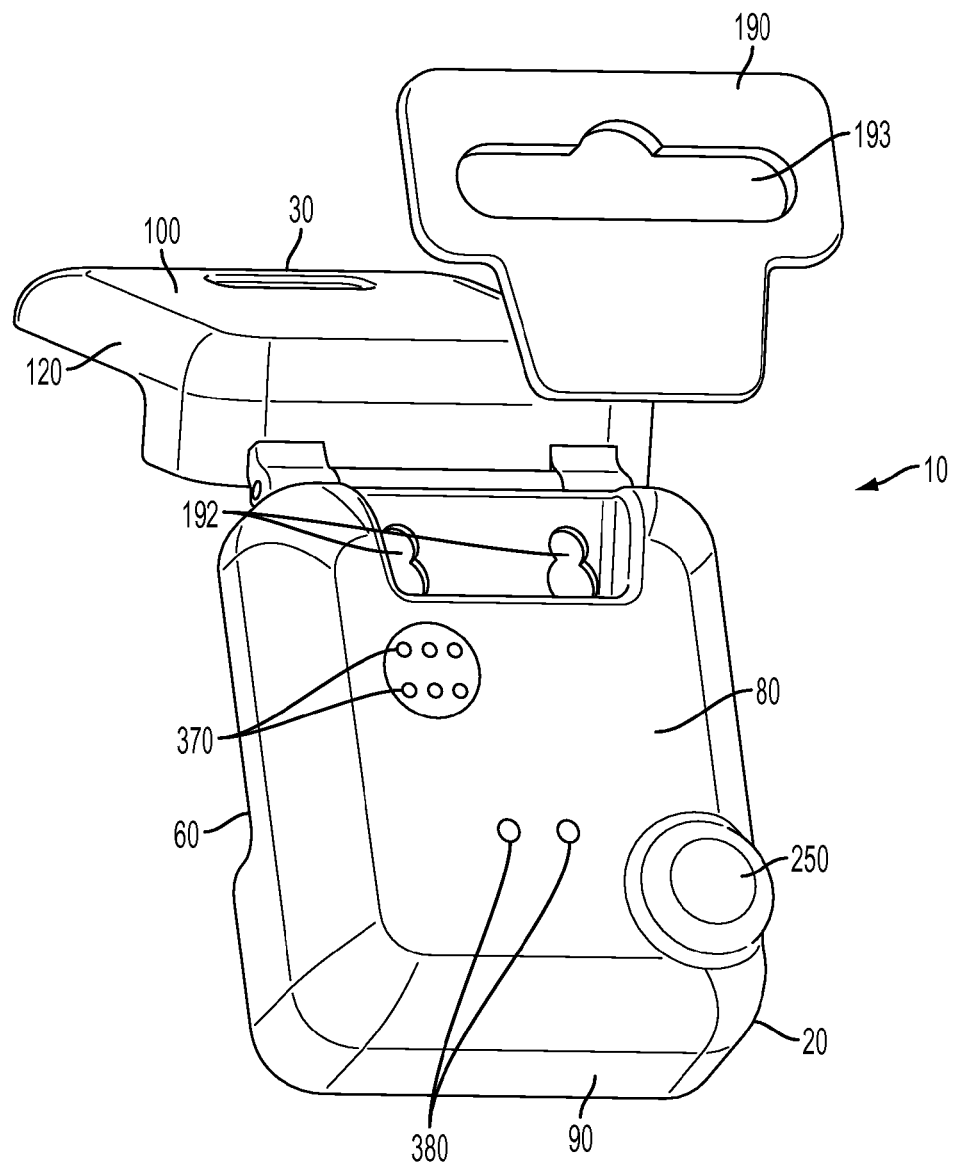
FIG. 1 is a perspective view of an embodiment of an anti-theft device, in one of its many open positions, and with a hanging appendage detached from the device.

FIG. 1 shows an embodiment of the anti-theft device 10 of the present invention from one perspective. This figure shows anti-theft device 10 in one of its many open positions with a first component 20, consisting of housing 60, hingedly connected to a second component 30, consisting of cover 100. In the embodiment of anti-theft device 10 shown in FIG. 1, housing 60 has bottom 80 and four sides 90.

Figure 2:
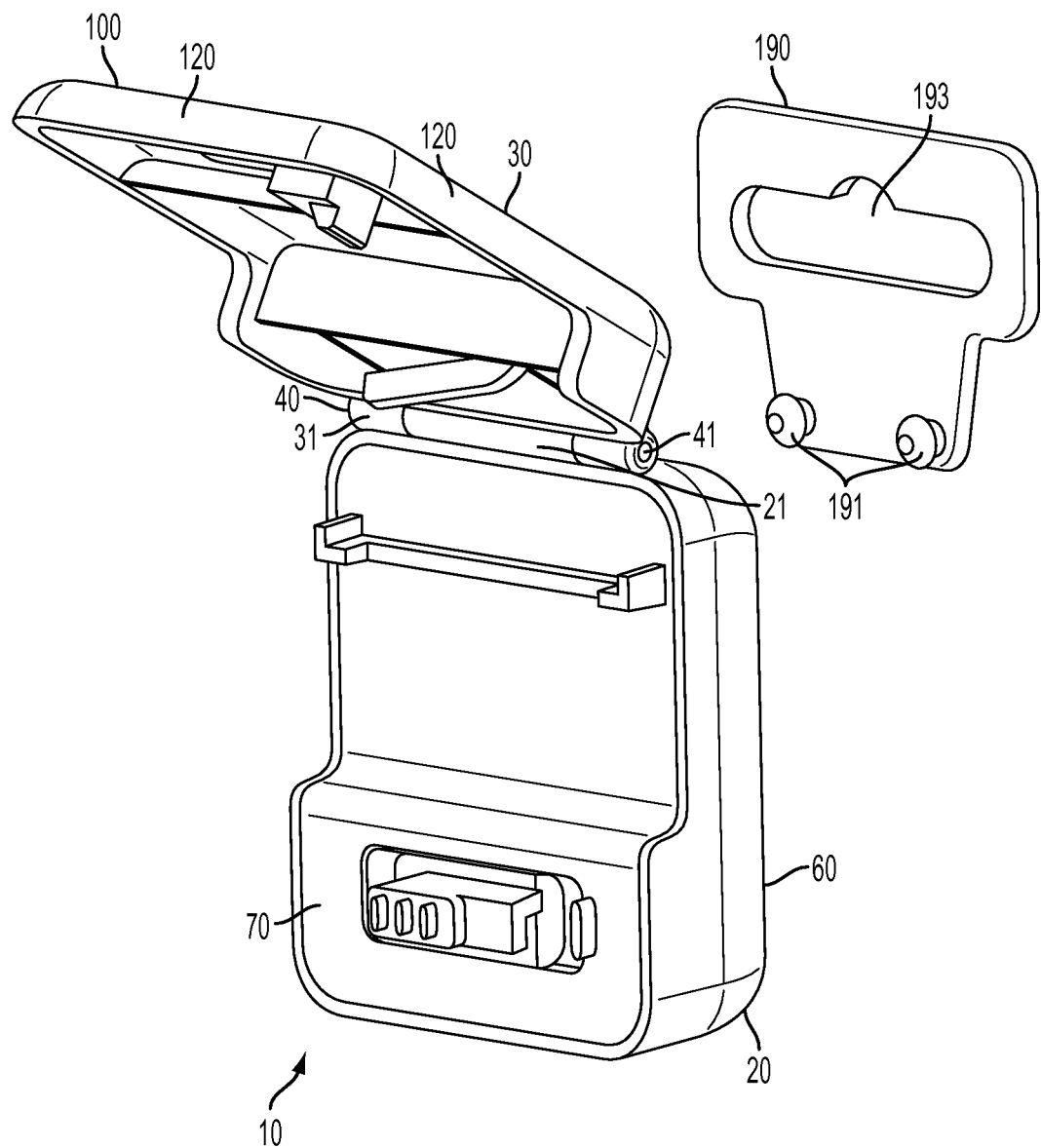
FIG. 2 is a perspective view of an embodiment of an anti-theft device, from a different perspective than shown by FIG.

Some embodiments of anti-theft device 10 have first hinge component 21 and second hinge component 31, which can be aligned with one another in a manner that forms hinge axis 40, into which hinge axis pin 41 can be fitted to facilitate the hinged connection of first component 20 and second component 30. First hinge component 21 and second hinge component 31 can rotate about hinge axis 40 in a range between a fully open position and a fully closed position. FIG. 1 and FIG. 2 show anti-theft device 10 in a mostly open position.

FIG. 2 shows cover 100 with four sides 120. When first hinge component 21 and second hinge component 31 are rotated about hinge axis 40 to place anti-theft device 10 into the closed position, cover 100 covers top 70 of housing 60. Hinge axis pin 41 maintains engagement of first hinge component 21 with second hinge component 31.

FIG. 2 shows hanging appendage 190 which has protrusions 191. Protrusions 191 of hanging appendage 190 may be fitted into housing apertures 192 (Shown in FIG. 1) in a manner which attaches hanging appendage 190 to housing 60 of anti-theft device 10. A hook or other hanging device may be fitted into tag aperture 193 so that anti-theft device 10 may be suspended from or attached to said hook or other hanging device, as is common for retail display of an object to be monitored.

FIGS. 3 and 4 are perspective views of the embodiment of anti-theft device 10 in one of the many open positions to reveal central panel 110 of cover 100. Housing 60 component and cover 100 component are hingedly connected. Hanging appendage 190 is attached to anti-theft device 10.

Referring to FIG. 5, which shows an exploded view of an embodiment of anti-theft device 10 in one of its many open positions, housing top aperture 150 in top 70 of housing 60 carries latch slide 130. Latch slide 130 may be slideably moved in housing top aperture 150 when latch button 160, connected to latch slide 130, is manipulated. Latch button 160 extends through cover aperture 170 of cover 100 when anti-theft device 10 is in a closed position. (See FIG. 4). Latch hook 140 located on latch button 160 is situated in relation to latch hook receiver 141 located on cover 100, so that when anti-theft device 10 is in a closed position, latch slide 130 can be slideably moved via manipulation of latch button 160 in a manner that engages latch hook 140 with latch hook receiver 141. (See FIG. 3). In one of the embodiments of anti-theft device 10 of FIG. 5, cantilever spring 101, shown in the present embodiment as being located on cover 100, bears upon housing component 60 and biases housing 60 and cover 100 of anti-theft device 10 toward one of the many open positions. (See FIG. 2). Latch plate aperture 221, latch aperture 131, and latch button aperture 161 are also seen in FIG. 5.

FIG. 6 is a perspective cutaway view of an embodiment of anti-theft device 10 in the closed position. Blocking component 200 normally fits into cup 210 through aperture 211 in the underside of cup 210. Cup 210 sits in cup seat 215. A portion of blocking component 200 protrudes through cup aperture 240. Spring 230 biases blocking component 200 toward cover 100. Latch plate spring 231 biases latch plate 220 toward blocking component 200. When first hinge component 21 and second hinge component 31 are rotated about hinge axis 40 to place anti-theft device 10 into a closed position, anti-theft device aperture 171 clasps around an object to be monitored, or a shaft or other element associated with the object to be monitored, in such a manner as to deter forcible disengagement of the object to be monitored from anti-theft device 10.

Referring again to FIG. 6, connecting pin 132 fits into latch plate aperture 221, latch aperture 131, and latch switch aperture 161 to interconnect latch plate 220, latch slide 130, and latch button 160, so that these latter three parts can be slideably moved in unison.

When anti-theft device 10 is in the closed position, and latch button 160 is manipulated to interlock latch hook 140 and latch hook receiver 141, blocking component 200 moves to a blocking position in relation to latch plate 220. When blocking component 200 is in a blocking position in relation to latch plate 220, disengagement of latch hook 140 from latch hook receiver 141 via manipulation of latch button 160 is deterred by blocking component 200.

Blocking component 200 has a magnetically attractable element associated with it. Referring back to FIG. 1, application of a magnet to bottom 80 of housing 60 retracts blocking component 200 into cup 210 and compresses spring 230. Dome 250 on bottom 80 of housing 60 provides a visual indication of where to apply a magnet.

Referring again to FIG. 6, retraction of blocking component 200 allows latch plate spring 231 to bias latch plate 220 in a direction where latch hook 140 and latch receiver 141 disengage from one another. First hinge component 21 and second hinge hinge component 31 can then freely rotate around hinge axis 40 so that anti-theft device 10 can achieve one of its many open positions. When latch plate 220 is in a position where latch hook 140 and latch hook receiver 141 are not engaged, latch plate 220 covers cup aperture 240, retaining blocking component 200 in a retracted position.

It is further envisioned that some embodiments of anti-theft device 10 generate a signal detectable by an interrogation field, including interoperability with existing electronic article surveillance (EAS) systems. While most commercially available EAS systems operate on a frequency of 58 kHz, other arrangements are also possible, and the present device is not limited to any particular frequency. This signal may be generated by any of the known methods, by means of a resonator or a ferrite located in the device, which is a typical arrangement with conventional EAS markers. The interrogation field can be generated by an antenna system which antenna system itself can alarm, as is conventional in EAS systems.

Referring again to FIG. 5, some embodiments of anti-theft device 10 may include passive electronic article surveillance (EAS) elements within internal compartment 260 of housing 60, which work interoperably with existing EAS systems that generate interrogation fields at exits and entrances to retail and other business establishments, as well as at other monitored areas to these establishments. The embodiment of anti-theft device 10 shown in FIG. 5 shows passive sensor 50 which contains ferrite core 51. Ferrite core 51 is surrounded by electrical coil 52.

The interrogation field builds up energy in electrical coil 52 and ferrite core 51 while transmitting. When the interrogation field ceases, the energy in coil 52 and ferrite core 51 dissipates and generates a signal that is a harmonic of the interrogation field. The EAS system monitors for these harmonics, and when a harmonic signal is detected, the system determines the anti-theft device 10 is present in the monitored area and an alarm condition is determined by the system.

Aside from the coil and core type of passive element that may be present in some embodiments of anti-theft device 10, anti-theft device 10 could carry other types of passive elements. An example of one such other type of passive element is comprised of two metallic strips which are loosely mounted in proximity to each other. The two strips are designed and sized to resonate when placed in the interrogation zone. The EAS system is tuned to detect the signal from the resonant anti-theft device.

Internal compartment 260 within housing 60, as seen in FIG. 5, may also contain such active electronic components as are seen in FIG. 7. These active components may comprise circuit board 270, microprocessor 280, cover switch 290, latch switch 295, audible alarm generator 300, infrared communication port 310, light emitting diode 320, battery 330, as well as other electronic elements such as additional communication elements for other communication techniques like radio frequency communication, etc.

In some embodiments of the present anti-theft device, top 70 of housing 60 may have cover switch aperture 350 (seen in FIG. 5) through which cover switch 290 (seen in FIGS. 3, 4, and 7) protrudes. Referring again to FIG. 3, when cover 100 covers top 70 of housing 60, cover 100 actuates cover switch 290. (Cover 100 is typically then latched into a closed position relative to housing 70 by manipulating latch slide 130 with latch button 160 to engage or interlock latch hook 140 with latch hook receiver 141). The change in status of cover switch 290 is detected by circuit board 270 and microprocessor 280. Anti-theft device 10 may then be armed. In embodiments having latch switch 295 (seen in FIG. 7), the movement of latch slide 130 (seen in FIG. 6) to the engaged position will actuate latch switch 295. This actuation of latch switch 295 in combination with the prior actuation of cover switch 290 can combine to arm anti-theft device 10. In some embodiments, after cover 100 actuates cover switch 290, anti-theft device 10 may be armed by communication from an external device such as a hand-held remote. Such communication between anti-theft device 10 and an external device may be infrared communication via infrared communication port 310, radio frequency communication, or other known methods of communication.

Once anti-theft device 10 is armed, if it is removed from the object being monitored without a prior disarming communication, the electronics of anti-theft device 10 will determine the existence of an alarm condition and issue an alarm. The alarm may be an audible alarm generated by audible alarm generator 300 (seen in FIG. 7). The alarm may also be broadcast by infrared communication, radio frequency communication, or other type of communication. Receivers in the broader EAS systems such as those in base stations, handheld devices, etc. receive the broadcast alarm and can communicate to personnel with screen displays, audible alarms, etc. that an alarm condition has been determined in an anti-theft device, allowing such personnel to take appropriate action.

In FIG. 1, bottom 80 of housing 60 is visible. Bottom 80 has sound apertures 370 to provide direct access of the audible alarm to outside of housing 60. Bottom 80 of housing 60 also has sight apertures 380 to provide visibility to infrared communication port 310 and light emitting diode 320 (seen in FIG. 7). As noted previously, FIG. 1 includes dome 250 on bottom 80 which provides an indication of where to apply a magnet to retract blocking component 200.

Some embodiments of the present device may contain some or all of the active electronic surveillance elements as are seen in FIG. 7, such as infrared communication port 310, which provides a route to communicate with anti-theft device 10 via infrared communication methods; light emitting diode 320, which provides visual cues for the status of anti-theft device 10; and, circuit board 270 and microprocessor 280, which are capable of storing machine readable instructions and are programmable to monitor the status of anti-theft device 10 and to communicate with remote programmers and other elements of an anti-theft device. Circuit board 270 and microprocessor 280 may be reprogrammed via communication with hand held remotes, such as handheld remote 360 in FIG. 8, or other elements of anti-theft device system when communicating with these anti-theft devices.

With the active EAS elements (shown in FIG. 6) that may be included in some embodiments of the present device, circuit board 270 and microprocessor 280 can communicate via infrared communication port 310 and also receive programming instructions. Audible alarm generator 300 is capable of generating an audible alarm when anti-theft device 10 is tampered with, as, for example, if cover 100 is separated from the top 70 of housing 60 during an unauthorized removal of anti-theft device 10 from the object being monitored, thus changing the status of cover switch 290. The change in status of cover switch 290 is detected by circuit board 270 and microprocessor 280 which can determine an alarm status for anti-theft device 10 and generate an alarm signal.

Audible alarm generator 300 may also be used to indicate the status of anti-theft device 10 as it is installed. For example, when hinge component 21 and 31 are rotated around hinge axis 40 so that first component 20 and second component 30 achieve the closed position in relation to one another, cover 100 contacts top 70 of housing 60 and bears upon cover switch 290, changing the status of cover switch 290. Audible alarm generator 300 can produce a sound indicating that anti-theft device 10 is installed and ready to be armed by another device such as handheld remote (seen in FIG. 8), or armed by moving latch slide 130 to engage latch hook 140 with latch hook receiver 141, which changes the status of latch switch 295. Similarly, light emitting diode 320 can be used to provide visual cues for the status of anti-theft device 10. Battery 330 generally provides power for the electronic components of anti-theft device 10, such as audible alarm generator 300, microprocessor 280, light emitting diode 320, etc.

Referring again to FIG. 5, passive sensor 50 is a passive element compatible with prior art EAS systems. These EAS systems generate what is called an interrogation field at a given frequency. These interrogation fields will build up a small amount of stored energy on passive EAS elements brought into the zone. When the interrogation field is turned off and the EAS system listens for a response, the passive EAS elements, such as passive sensor 50, dissipate their energy and generate a signal at a designed frequency. The EAS system is capable of detecting the signal as an indication of the unauthorized presence of the passive elements and can generate an alarm based on the signal. Passive sensor 50, as shown in FIG. 5, contained within the embodiment of anti-theft device 10, is compatible with prior art and legacy systems providing an additional security mechanism.

In addition to the prior art detection system of passive sensor 50 (seen in FIG. 5), and referring again to FIG. 7, in some embodiments, circuit board 270 and microprocessor 280 can monitor the status of passive sensor 50 and issue an alarm as well. If microprocessor 280 or circuit board 270 detects energy storage and dissipation activity in the coil, then audible alarm generator 300 may be instructed to generate an alarm or the communication capabilities of the electronics may be employed to broadcast a signal to respective receivers in the broader EAS system to generate an alarm. While passive sensor 50, shown in FIG. 5, is indicated as a core and coil type of element, any passive element known in the art could be used.

FIG. 6 is a cutaway view of one embodiment of anti-theft device 10 in the closed position. Anti-theft device 10 can be moved to the closed position to close upon and grasp a solid member of an object to be monitored. Anti-theft device aperture 171 accommodates said solid member of an object to be monitored. As illustrated in FIG. 6, the closed position of anti-theft device 10 shows blocking component 200 in a blocking position in relation to latch plate 220. Latch plate spring 231 biases latch plate 220 in the direction of blocking component 200. Blocking component 200 is biased in the direction of cover 100 by spring 230. Latch hook 140 and latch hook receiver 141 are engaged with one another.

Referring again to FIG. 6, application of a magnet to dome 250 biases blocking component 200 toward bottom 80 of housing 60 and causes blocking component 200 to compress spring 230 as blocking component 200 retracts into cup 210. Blocking component 200 attains a non-blocking position in relation to latch plate 220 when blocking component 200 is sufficiently retracted into cup 210 to enable latch plate 220, via manual manipulation of latch button 160, to be slideably maneuvered to a position where latch plate 220 covers cup aperture 240. As latch plate 220 is thusly slideably maneuvered so as to cover cup aperture 240, latch hook 140, being moved in unison with latch plate 220 via manual manipulation of latch button 160, disengages from latch hook receiver 141, enabling first hinge component 21 and second hinge component 31 to rotate around hinge axis 40 so that anti-theft device 10 may be moved from the closed position to one of many open positions.

In some embodiments of anti-theft device 10, application of a magnet to dome 250 at bottom 80 of housing 60 will not, by itself, cause anti-theft device 10 to be moved into one of the many open positions. For example, in some embodiments, such as that illustrated in FIG. 6, the closed position can be maintained even after application of a magnet to dome 250 at bottom 80 of housing 60. In embodiments such as that shown in FIG. 6, as the magnet biases blocking component 200 toward bottom 80 of housing 60, second interlocking component 207, located on blocking component 200 will engage or interlock with first interlocking component 206 located on latch plate 220, thus impeding retraction of blocking component 200 into cup 240 which, in turn, enables anti-theft device 10 to maintain a closed position.

In embodiments such as in FIG. 6, the closed position can be maintained until application of a magnet to dome 250 at bottom 80 of housing 60 is accompanied with manual manipulation of latch button 160 in such a manner that latch plate 220 compresses latch plate spring 231. When latch button 160 is manipulated so that latch plate 220 compresses latch plate spring 231 to a sufficient degree, first interlocking component 206 is disengaged from second interlocking component 207 and spindle top 205 is prevented from catching against latch plate 220 as the interaction between the magnet and the magnetically attractable element of blocking component 200 directs blocking component 200 to retract into cup 240. Latch button 160 can then be manually manipulated to move latch slide 130 in a manner which disengages latch hook 140 from latch hook receiver 141.

FIG. 9 shows a hand held detacher 390 that may be used with some embodiments of anti-theft device 10 of the present device to activate, deactivate, arm, disarm, and detach the various embodiments of anti-theft device 10. In FIG. 9, hand-held detacher 390 is shown both assembled and exploded into components. Hand-held detacher 390 includes magnet 400 as well as some elements of handheld remote 360 described above with respect to FIG. 8. Hand-held detacher 390 also has infrared communication 410 or other communication element. Hand held detacher 390 can communicate with anti-theft device 10 to disarm it while magnet 400 of detacher 390 is placed on anti-theft device 10 to actuate a release of a latching mechanism in housing 60 and release housing 60 from cover 100. Radio frequency communication may be used as an alternative to infrared communication. Once the electronics of housing 60 are disarmed, first component 20 and second component 30 can be rotated to an open position, lifting cover 100 from housing 60, which will change the status of cover switch 290 (seen in FIG. 6), without generating an alarm from housing 60.

The electronics of some embodiments of anti-theft device 10 may have passcode protection. These embodiments are capable of storing a passcode which is required to be matched by handheld remote 360 (FIG. 8) or hand-held detacher 390 (FIG. 9) for various communications to be verified as authorized. For further protection, the electronics of some embodiments of anti-theft device 10 may include a clock generator and the electronics may have machine readable instructions with an algorithm to change the passcode at pre-programmed time intervals. The EAS system, including handheld remote 360, also has at least one clock generator and is capable of updating the passcode at the pre-programmed intervals to update the systems record of the passcode. This keeps the passcode between anti-theft device 10 and the rest of the EAS system synchronized.

Referring to FIG. 10, hand-held detacher 390 may be powered by cable 420 connected to an element within the EAS system, or hand-held detacher 390 may be powered by cable 420 connected to an element within the EAS system, or hand-held detacher 390 may simply be tethered to another object to prevent it from being mislaid or stolen. In some embodiments, cable 420 will provide communication capabilities between base station 440 and anti-theft device 10 via detacher 390.

FIG. 10 shows detacher 390 removed from its mount in a retail counter 430. In situations where the object being monitored by anti-theft device 10 is too large to be placed on a counter, detacher 390 may be extended from its typical position to be applied to the object and detach anti-theft device 10. Smaller objects can be applied to detacher 390 and base station 440.

It is to be understood that the embodiments and claims herein are not limited in application to the details of construction and arrangement of the components set forth in the description and illustrated in the drawings. Rather, the description and the drawings provide examples of the embodiments envisioned, but the claims are not limited to any particular embodiment or to a preferred embodiment disclosed and/or identified in the specification. The drawing figures are for illustrative purposes only, and merely provide practical examples of the anti-theft device disclosed herein. Therefore, the drawing figures should not be viewed as restricting the scope of the claims to what is depicted.

The embodiments and claims disclosed herein are further capable of other embodiments and of being practiced and carried out in various ways, including various combinations and sub-combinations of the features described above but that may not have been explicitly disclosed in specific combinations and sub-combinations. Accordingly, those skilled in the art will appreciate that the conception upon which the embodiments and claims are based may be readily utilized as a basis for the design of other structures, methods, and systems. In addition, it is understood that the phraseology and terminology employed herein are for the purpose of description and should not be regarded as limiting the claims.

I claim:

1. An anti-theft device comprising;
a first component hingably connected to a second component, said first and second components rotatable along a hinge axis between open and closed positions and, when in said closed position, defining a passageway for receiving a portion of an object to be monitored;
said first component comprising a latch, a first spring, and a housing defining an internal compartment, said latch including a first interlock element;
said second component comprising a latch receiver for receiving said latch when said first and second components are rotated to said closed position and said latch is moved to a latched position;
electronics located within said internal compartment;
a blocking component comprised of a second interlock element; and,
a second spring;
said second spring moving said blocking component into a blocking position to prevent a return of said latch when said first component and said second component are rotated to said closed position and said latch is moved to said latched position;
said first spring biasing said latch in said latched position toward said blocking component to interlock said first interlock element with said second interlock element.

2. The anti-theft device of claim 1, wherein:
said blocking component is at least partially comprised of a magnetically attractable material and can be retracted to a non-blocking position when specific conditions are met;
said specific conditions comprising the manipulation of said latch against said first spring to disengage said first interlock element from said second interlock element, and the application of a magnet to said anti-theft tag to overcome said second spring.

3. The anti-theft device of claim 2, wherein:
when said blocking component is retracted to said non-blocking position, and said manipulation of said latch is ceased, said first spring moves said latch into an unlatched position.

4. The anti-theft device of claim 3, wherein:
when said latch is in said unlatched position, said latch maintains said blocking component in said non-blocking position.

5. The anti-theft device of claim 1, wherein:
said electronics comprise a passive electronic article surveillance element.

6. The anti-theft device of claim 1, wherein:
said first component further comprises a switch aperture passing from said internal compartment to external of said housing;
said electronics comprise a circuit board, microprocessor, battery, audible alarm generator, and a closure switch;
said closure switch extending through said switch aperture in said housing;
said second component changing the state of said closure switch when said first and second components are moved to said closed position.

7. The anti-theft device of claim 6, wherein;
said electronics further comprise communication elements.

8. The anti-theft device of claim 6, wherein;
said electronics further comprise infrared communication elements.

9. The anti-theft device of claim 6, wherein;
said electronics further comprise radio frequency circuitry elements.

10. The anti-theft device of claim 6, wherein;
said electronics further comprise a latch switch.

11. The anti-theft device of claim 1, further comprising;
a hanger aperture for hanging said anti-theft tag and said object to be monitored.

12. The anti-theft device of claim 11, further comprising;
a first connector element;
a hanger member, said hanger member comprising said hanger aperture and a second connector element;
said first connector element connecting to said second connector element.

* * * * *